United States Patent
Murata et al.

(10) Patent No.: US 6,601,452 B2
(45) Date of Patent: Aug. 5, 2003

(54) SEMICONDUCTOR PRESSURE SENSOR HAVING ROUNDED CORNER PORTION OF DIAPHRAGM

(75) Inventors: Yuichiro Murata, Nagoya (JP); Inao Toyoda, Okazaki (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/866,792

(22) Filed: May 30, 2001

(65) Prior Publication Data
US 2001/0052266 A1 Dec. 20, 2001

(30) Foreign Application Priority Data

Jun. 5, 2000 (JP) ........................................ 2000-167823
Jun. 14, 2000 (JP) ........................................ 2000-178785

(51) Int. Cl.[7] ................................................. G01L 9/16
(52) U.S. Cl. .............................. 73/754; 73/700; 73/715
(58) Field of Search ................................ 73/700–756

(56) References Cited

U.S. PATENT DOCUMENTS

| | | | | |
|---|---|---|---|---|
| 4,984,466 A | * | 1/1991 | Yasui et al. | 73/721 |
| 4,984,468 A | * | 1/1991 | Hafner | 73/727 |
| 5,827,756 A | * | 10/1998 | Sugino et al. | 438/50 |

* cited by examiner

Primary Examiner—Edward Lefkowitz
Assistant Examiner—Andre Allen
(74) Attorney, Agent, or Firm—Posz & Bethards, PLC

(57) ABSTRACT

A semiconductor pressure sensor has a recess formed on a semiconductor substrate. The recess has a sidewall, a bottom wall that serves as a diaphragm for detecting a pressure, and a corner portion provided between the sidewall and the bottom wall and having a radius of curvature R. The radius of curvature R satisfies a formula of:

$$R/S = 526 \cdot (d/S)^2 - 0.037 \cdot (d/S) + a1,$$

where S is an area of the diaphragm, d is a thickness of the diaphragm, and a1 is in a range of $9.6 \times 10^{-7}$ to $16 \times 10^{-7}$ inclusive.

10 Claims, 13 Drawing Sheets

SEMICONDUCTOR PRESSURE SENSOR HAVING ROUNDED CORNER PORTION OF DIAPHRAGM

CROSS REFERENCE TO RELATED APPLICATIONS

This application is based upon and claims the benefit of Japanese Patent Applications No. 2000-167823 filed on Jun. 5, 2000 and No. 2000-178785 filed on Jun. 14, 2000, the contents of which are incorporated herein by reference.

BACKGROUND OF THE INVENTION

1. Field of the Invention

This invention relates to a semiconductor pressure sensor having a diaphragm that is formed by a recess formed on a semiconductor substrate for detecting a pressure.

2. Description of the Related Art

JP-A-11-97413 proposes a diaphragm type semiconductor pressure sensor in which a recess is formed on a semiconductor substrate (silicon substrate) by anisotropic etching to form a diaphragm on a bottom of the recess for receiving a pressure. Bottom side corner portions of the recess defining the diaphragm (back surface of the diaphragm) are rounded by means of isotropic etching to improve a breaking strength of the diaphragm. That is, the back surface edge portion of the diaphragm has an R-shape in cross-section. However, it is found that if the edge portion is rounded excessively, the etching time is lengthened to reduce the throughput.

SUMMARY OF THE INVENTION

The present invention has been made in view of the above problems. An object of the present invention is to provide a diaphragm type semiconductor pressure sensor in which a back surface edge portion of a diaphragm can be rounded efficiently while keeping a sufficient breaking withstand pressure of the diaphragm.

According to an aspect of the present invention, a semiconductor pressure sensor has a recess formed on a semiconductor substrate by anisotropic etching. The recess has a sidewall, a bottom wall that serves as a diaphragm for detecting a pressure, and a corner portion provided between the sidewall and the bottom wall and having a radius of curvature R. The radius of curvature R satisfies a formula of:

$$R/S = 526 \cdot (d/S)^2 - 0.037 \cdot (d/S) + a1,$$

where S is an area of the diaphragm, d is a thickness of the diaphragm, and a1 is in a range of $9.6 \times 10^{-7}$ to $16 \times 10^{-7}$ inclusive. In this case, the corner portion can be rounded efficiently for a short etching time by anisotropic etching.

According to another aspect of the present invention, a bonding surface of a base having a pressure introduction passage is bonded to a semiconductor substrate having a recess and a diaphragm as a bottom wall of the recess. A bonding angle defined between a sidewall of the recess and the bonding surface of the base is equal to or larger than 80° so that a separation withstand pressure of a bonding portion where the base is bonded to the semiconductor substrate is larger than a breaking withstand pressure of the diaphragm. A length of a portion defining the bonding angle equal to or larger than 80° holds preferably 50% at least, and more preferably 80% at least with respect to an entire length of the bonding portion surrounding the recess.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

Figure 1:
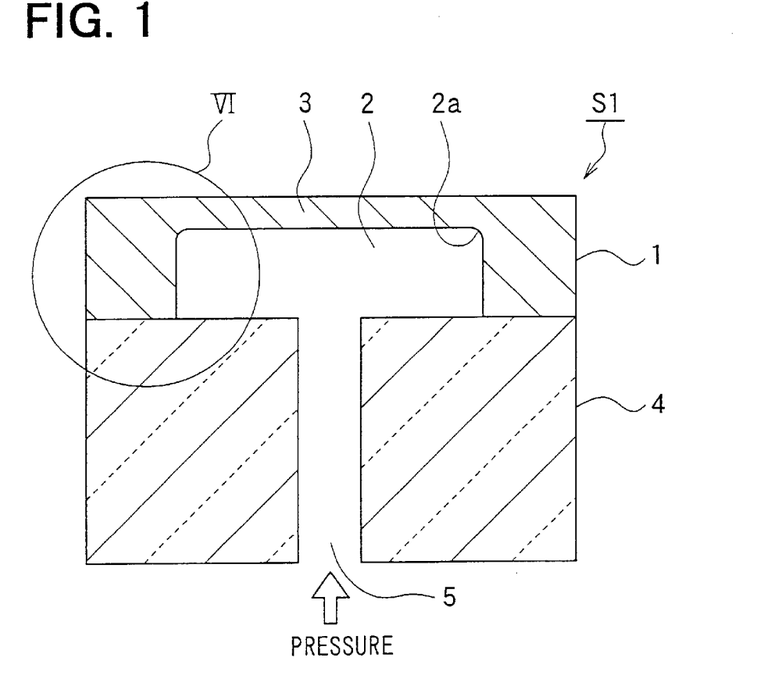
FIG. 1 is a cross-sectional view showing a semiconductor pressure sensor according to a first preferred embodiment of the present invention.
Figure 2:
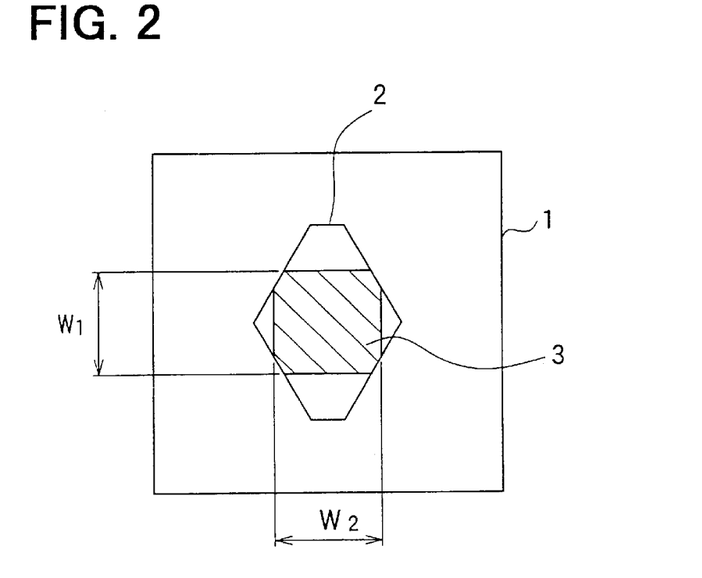
FIG. 2 is a plan view showing a plane shape of a diaphragm of the pressure sensor shown in FIG. 1.

Referring to FIGS. 1 and 2, a semiconductor pressure sensor S1 according to a first embodiment of the present invention has a single crystal semiconductor substrate 1, a plane orientation of which is a (110) plane. A recess 2 is formed on the semiconductor substrate 1 with a bottom that serves as a diaphragm 3 for detecting a pressure. The diaphragm 8 has an octagonal plane shape. As shown in FIG. 1, an edge portion 2a (corner portion) of the surface of the diaphragm 3 at the side of the recess 2 (back surface of the diaphragm) is rounded into an R-shape in cross-section.

The diaphragm 3 may be formed as follows. Specifically, a mask having a specific pattern is formed on a surface of the semiconductor substrate 1, and the recess 2 is formed on the semiconductor substrate 1 by anisotropic etching using KOH, TMAH or the like. Further, isotropic etching involving anodic oxidation as disclosed in JP-A-11-97413 is carried out to round the back surface edge portion 2a of the diaphragm. Thus, the diaphragm 3 can be formed. The recess 2 may be formed by dry etching.

Incidentally, in the present embodiment, a single crystal silicon substrate having a (110) plane orientation is adopted as the semiconductor substrate 1, and the mask pattern has an opening corresponding to the opening shape of the recess 2, for forming the diaphragm 3 by etching as described above. Accordingly, the diaphragm 3 can be formed to have an octagonal plane shape that is hatched in FIG. 2.

Strain gauges (not shown) are formed on the surface of the diaphragm 3 (at an opposite side of the semiconductor substrate with respect to the recess 2) by a semiconductor process such as diffusion. The strain gauges constitute a bridge circuit that produces an electrical signal in accordance with deformation of the diaphragm 3, thereby enabling the detection of applied pressure.

A base 4 made of glass is joined to the semiconductor substrate 1 by anodic bonding so as to cover the recess 2. The base 4 defines therein a pressure introduction passage 5 through which the recess 2 communicates with an outside thereof. Pressure to be measured (measurement pressure) is introduced into the recess 2 through the pressure introduction passage 5, and the diaphragm 3 receives the measurement pressure at the back surface thereof. The base 4 may be made of silicon.

Here, in the present embodiment, the back surface edge portion 2a of the diaphragm 3 is rounded to have a radius of curvature R that satisfies the following formula (1) in which d represents a thickness of the diaphragm 3 and S represents an area (area of the octagonal plane shape in this embodiment) of the diaphragm 3.

$$R/S = 526 \cdot (d/S)^2 - 0.037 \cdot (d/S) + a1 \quad (1)$$

Here, a1 satisfies a relationship of $9.6 \times 10^{-7} \leq a1 \leq 16 \times 10^{-7}$. The formula (1) with respect to the radius of curvature R was obtained as a result of studies and examination in order to provide the R-shape of the back surface edge portion 2a capable of exhibiting the maximum effect for improving the breaking strength of the diaphragm 3 without lengthening etching time unnecessarily.

Further, the relationship between the shape and the breaking strength of the diaphragm 3 was studied by a FEM (finite element method) stress analysis. Specifically, stress, which is generated at a stress maximum part (i.e., the back surface edge portion 2a of the diaphragm 3), is found when a pressure is applied to the diaphragm. Breaking withstand pressure is determined as the pressure that is applied when the found stress reaches the breaking strength.

Thus, the breaking withstand pressure of the diaphragm can be expected with changes in area S, thickness d, radius of curvature R of the diaphragm by a simulation model. Explained below is a result obtained from the sensor S1 of the preset embodiment by the simulation using the FEM analysis. In this simulation, as dimensions of the diaphragm 3, referring to FIG. 2, W1 was set at 1.3 mm and W2 was set at 1.4 mm.

Figure 3:
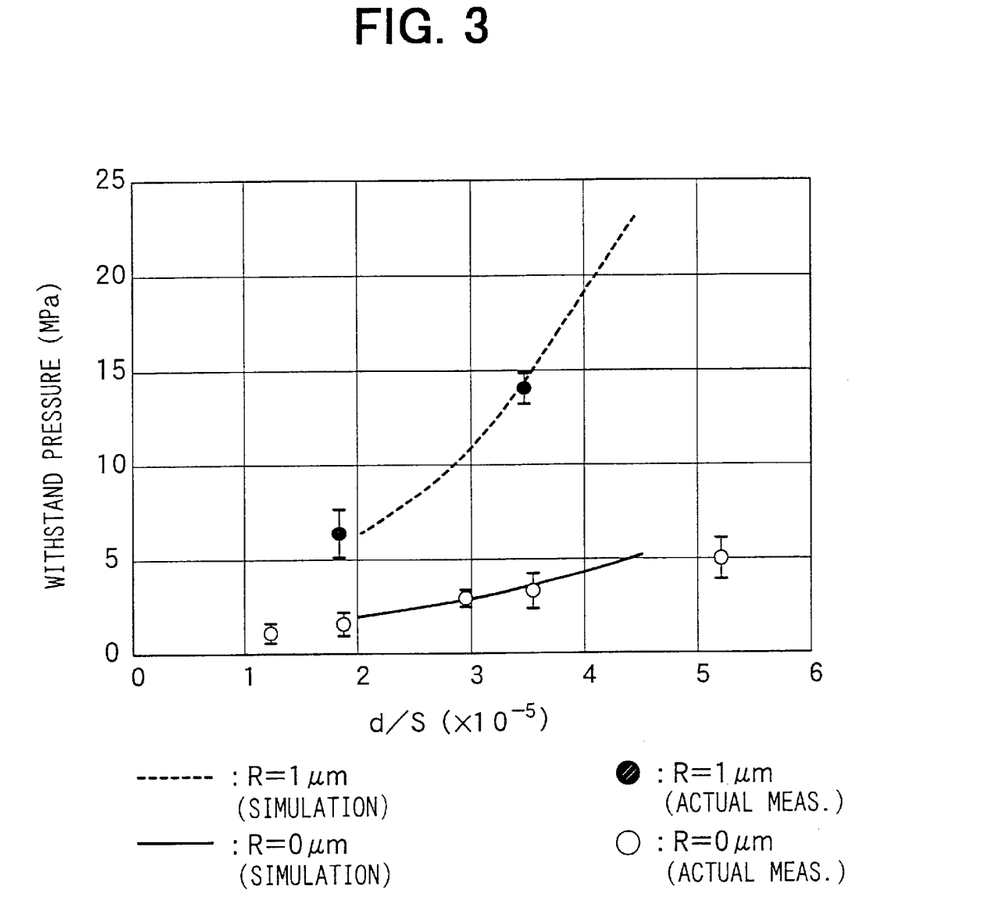
FIG. 3 is a graph showing a relationship between a ratio d/S and breaking withstand pressure of the diaphragm, in which d represents a thickness of the diaphragm and S represents an area of the diaphragm.

FIG. 3 shows simulation results and actual measurements in the relationship between ratio d/S of the thickness d and the area S of the diaphragm 3 and the diaphragm breaking withstand pressure. FIG. 3 also shows a case where the radius of curvature R is 1 μm and a case where the radius of curvature R is 0 μm (i.e., the edge portion is not rounded). Here, each plot width indicated with mark ● or ○ is 3σ. Thus, it is revealed that the simulation results coincide with the actual measurements sufficiently.

Figure 4:
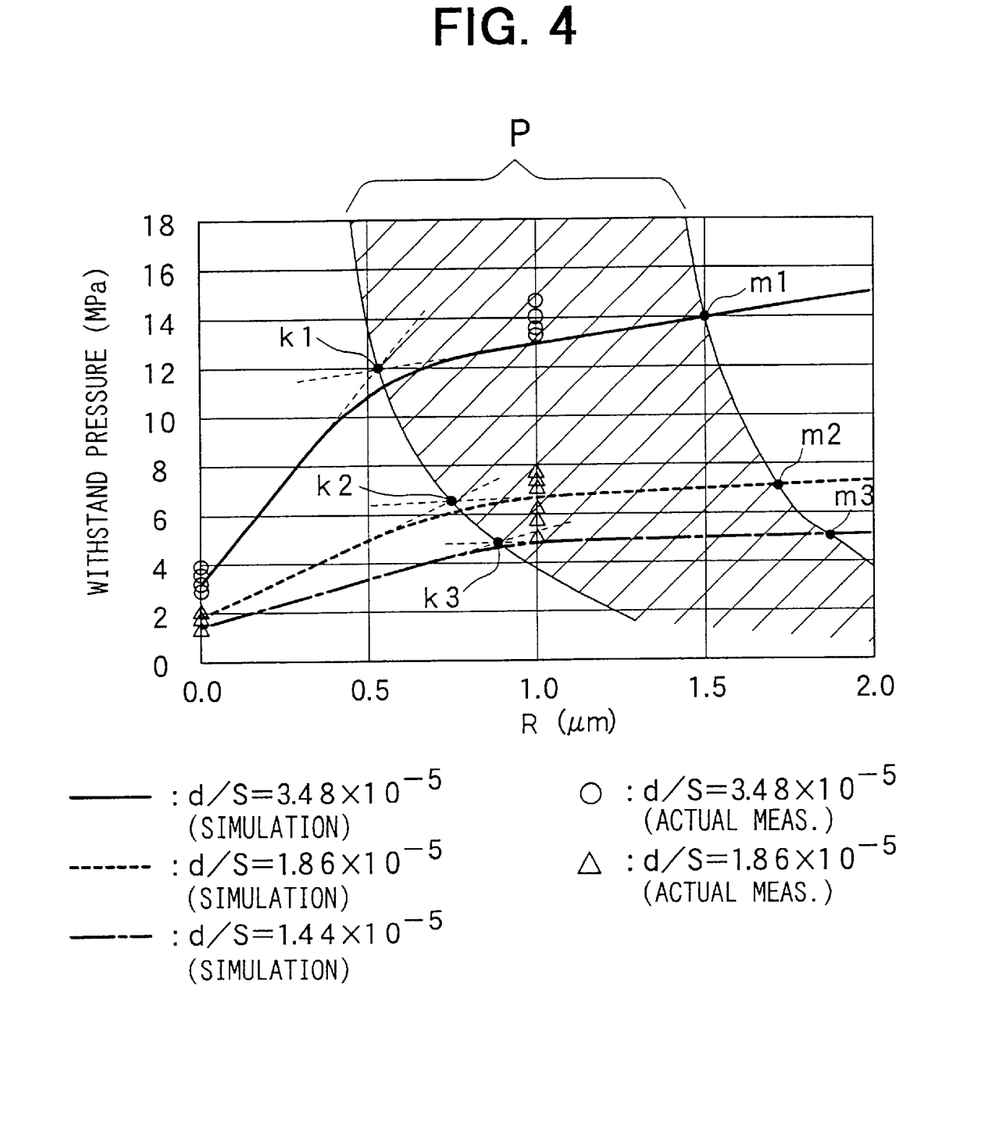
FIG. 4 is a graph showing a relationship between radius of curvature R and the breaking withstand pressure of the diaphragm.

FIG. 4 shows simulation results (R-withstand pressure curve) in a relationship between the breaking withstand pressure and the radius of curvature R of the diaphragm. Specifically, FIG. 4 shows R-withstand pressure curves in three cases where the ratios d/s are $3.48 \times 10^{-5}$ (bold solid curve), $1.86 \times 10^{-5}$ (bold broken curve), and $1.44 \times 10^{-5}$ (bold one-dot chain curve), respectively, as a result of the simulation. Points plotted with mark ○ ($d/S = 3.48 \times 10^{-5}$) and mark Δ ($d/S = 1.86 \times 10^{-5}$) are actual measurements.

FIG. 4 reveals that although the diaphragm breaking withstand pressure is improved as the radius of curvature R is increased, the degree of improvement is saturated at a certain stage. That is, the effect for improving the breaking withstand pressure is saturated at the certain stage even when the radius of curvature R is increased, and after that, the effect is hardly enhanced despite that the etching time is lengthened in accordance with the increase in radius of curvature R.

Here, in each R-withstand pressure curve in FIG. 4, approximate lines (fine broken lines) are drawn with respect to a part where the improvement degree of the withstand pressure is large, and a part where the improvement degree of the withstand pressure is small (saturated portion), respectively, and an intersection point is plotted with K1, K2, or K3, which is considered as a critical point (saturation point). When the diaphragm 3 has the radius of curvature R corresponding to the critical point K1, K2, or K3 with the corresponding ratio d/s, the maximum effect for improving the diaphragm breaking strength can be exhibited at the minimum etching time for rounding the edge portion 2a with the radius of curvature R (i.e., with the minimum radius of curvature R).

When the edge portion 2a is isotropically etched to be rounded, processing error is unavoidable. Therefore, when the etching is performed for a preset etching time so that the radius of curvature R corresponds to the critical point K1, K2, or K3 at the minimum, there is a possibility that the radius of curvature R may reach the magnitude corresponding to point m1, m2, or m3 in FIG. 4 assuming the occurrence of processing error.

A curve linking the points m1, m2 and m3 is translated in parallel with the curve linking the critical points k1, k2, and k3 by the magnitude corresponding to the processing error caused by the etching. That is, the edge portion 2a of the diaphragm 3 can have the radius of curvature R in a range corresponding to hatching region P in FIG. 4.

Figure 5:
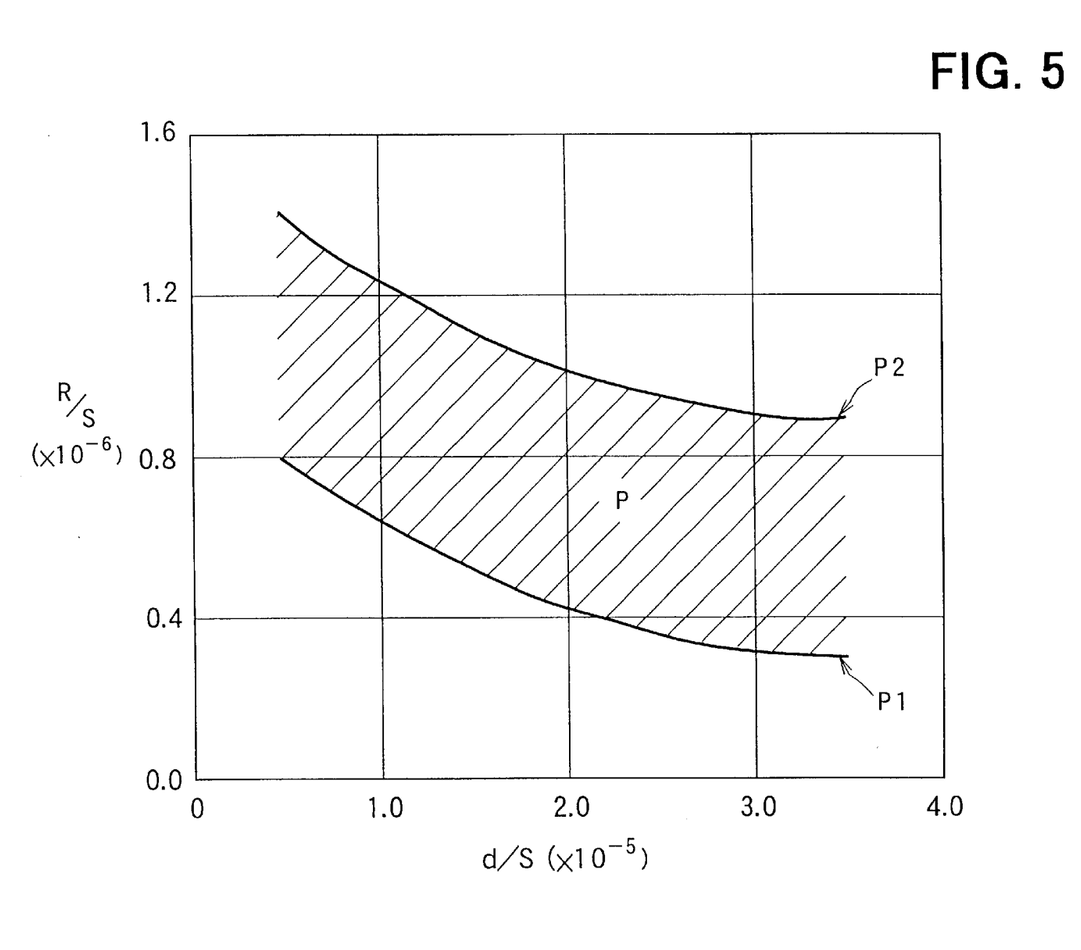
FIG. 5 is a graph showing a relationship between ratio d/S and ratio R/S.

FIG. 5 shows a relationship between ratio d/S and ratio R/S of the region P that is also a hatching region in FIG. 5. Lower side curve P1 in FIG. 5 corresponds to the curve showing the lower limit (curve linking the critical points k1, k2, and k3) in FIG. 4, and represents the formula (1) in which a1 is $9.6 \times 10^{-7}$. Upper side curve P2 in FIG. 5 corresponds to the curve showing the upper limit (curve linking the points m1, m2, and m3) in FIG. 4, and represents the formula (1) in which a1 is $16 \times 10^{-7}$.

The region P shown in FIG. 5 is enciphered. Accordingly, the relationship between ratios d/S and R/S, and the range of a1 in the formula (1) can be determined. Therefore, if the radius of curvature R of the diaphragm 3 is set to satisfy the formula (1), the breaking strength of the diaphragm 3 can be improved sufficiently by performing the isotropic etching for the minimum etching time to round the edge portion 2a of the diaphragm 3.

The formula (1) involves the processing error caused by the etching for rounding the edge portion 2a. However, it is most preferable that the radius of curvature R coincides with the point on the curve showing the lower limit (linking the critical points k1, k2, and k3) in FIG. 4, i.e., with the point on the curve P1 in FIG. 5. That is, it is most preferable that a1 is $9.6 \times 10^{-7}$ in the formula (1).

Thus, according to the present embodiment, the radius of curvature R of the edge portion 2a of the diaphragm 3 is controlled to satisfy the formula (1). In this case, the diaphragm 3 can be efficiently formed while improving the breaking strength of the diaphragm 3. Further, in the sensor S1 of the present embodiment, the plane shape of the diaphragm 3 is octagonal. Therefore, stress strain at the bonding portion between the semiconductor substrate 1 and the base 4 can be reduced as compared to a case where the plane shape of the diaphragm is rectangular. This is preferable from a point of improvement in withstand pressure because the breaking withstand pressure at the bonding portion can be increased.

The semiconductor substrate 1 is not limited to the single crystal silicon substrate having a (110) plane orientation. For example, the plane orientation may be a (100) plane. Also, the shape of the diaphragm 3 is not limited to the octagonal shape, but may be other shapes such as a rectangle. That is, the present embodiment is characterized in that the radius of curvature R of the back surface edge portion of the diaphragm satisfies the relationship represented by the formula (1), and the other features will be changed appropriately.

(Second Embodiment)

A semiconductor pressure sensor S2 according to a second embodiment will be explained referring to FIGS. 6 to 15 in which the same parts as those in the first embodiment are designated with the same reference numerals.

Figure 6:
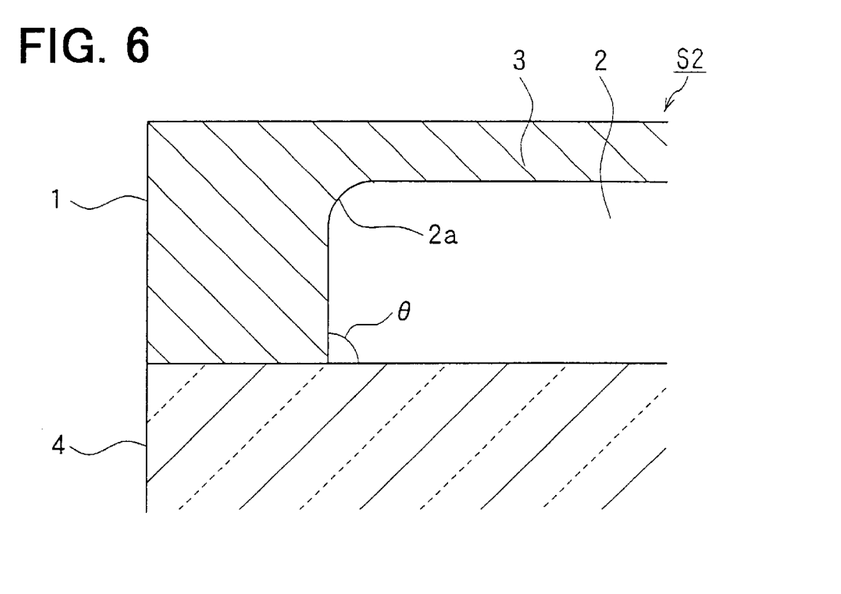
FIG. 6 is an enlarged cross-sectional view showing a semiconductor pressure sensor in a second preferred embodiment of the present invention, at a portion corresponding to that indicated with circle VI in FIG. 1.

Referring first to FIG. 6, in the second embodiment, at the bonding portion between the semiconductor substrate 1 and the base 4, a bonding angle θ formed between the side face of the recess 2 and the base 4 is made equal to or larger than 80° at regions as many as possible. Accordingly, separation withstand pressure is made larger than the breaking withstand pressure of the diaphragm 3 at this bonding portion.

Figure 7:
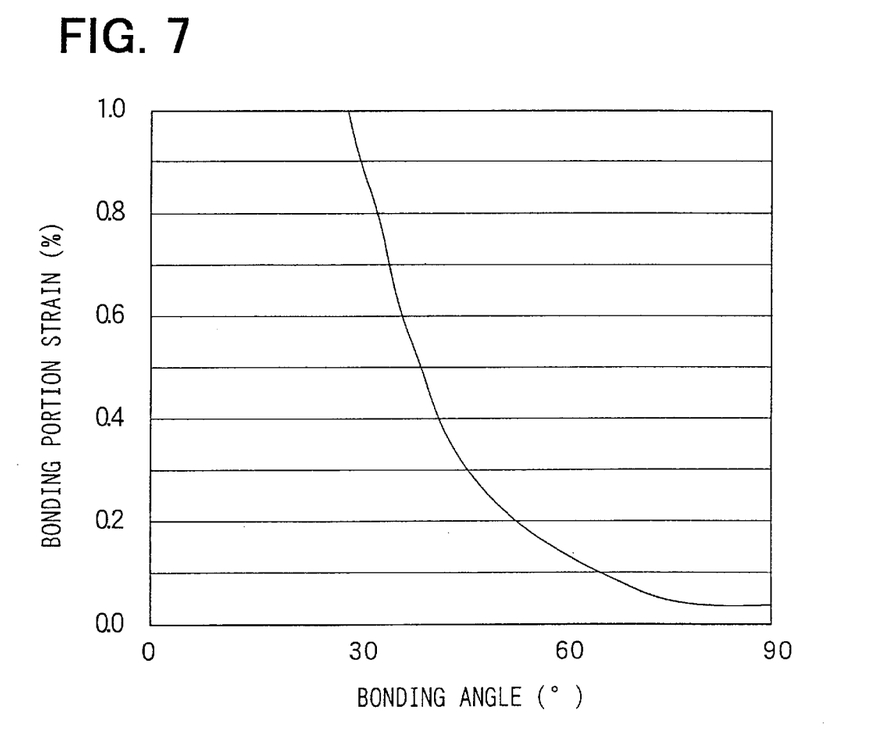
FIG. 7 is a graph showing a relationship between bonding angle θ and bonding portion strain.

This structure is based on the following studies and examinations. FIG. 7 shows a relationship between bonding angle (°) and strain (%), i.e., bonding portion strain, produced at the bonding portion between the semiconductor substrate and the base, which was obtained by a simulation using the FEM (finite element method).

As shown in FIG. 7, it is revealed that the bonding portion strain decreases as the bonding angle θ increases, and the bonding portion strain is almost saturated with a very small value as the bonding angle is larger than about 80°. Incidentally, although a little processing error is unavoidable, the upper limit of the bonding angle θ is substantially 90°.

The bonding strength between the semiconductor substrate 1 and the base 4 can be improved when the portion having the bonding angle θ being larger than about 80° occupies at least a certain ratio of the entire bonding portion. In consequence, high reliability of the bonding portion can be attained.

Figure 8:
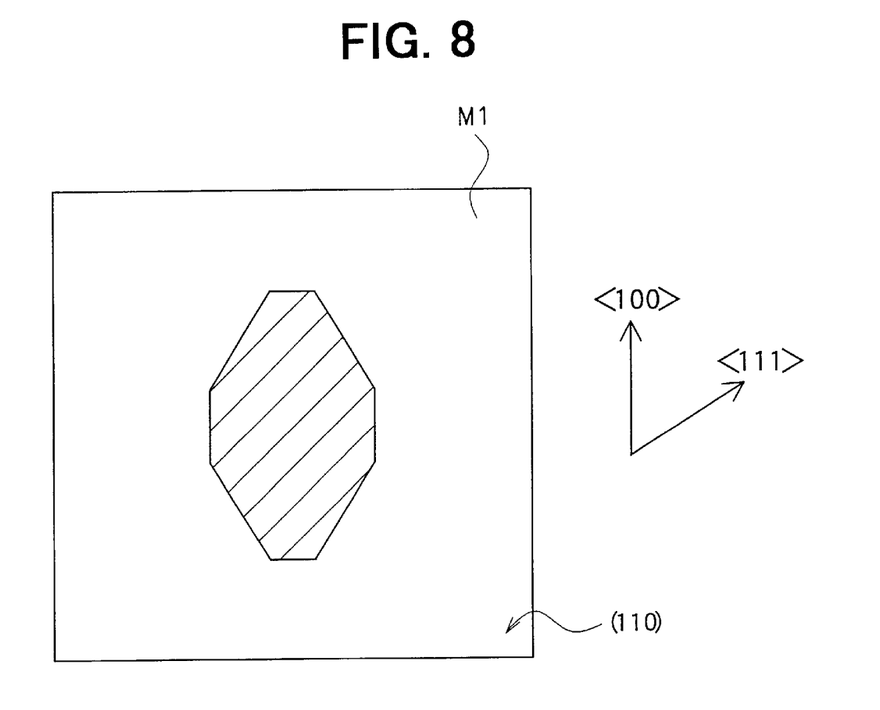
FIG. 8 is a plan view showing a mask pattern for forming a diaphragm shown in FIG. 6.

This effect for improving the bonding strength is more specifically explained based on the pressure semiconductor sensor S2 in this present embodiment. FIG. 8 shows a plane shape of a mask pattern for forming the diaphragm 3, and FIGS. 9A to 9D show a detailed shape of the diaphragm 3 formed by the mask pattern.

In this embodiment, a single crystal silicon substrate having a (110) plane orientation is adopted as the semiconductor substrate 1. As the mask pattern for forming the diaphragm 3 by etching, a mask M1 having an octagonal opening shown in FIG. 8 with hatching is formed on the surface of the semiconductor substrate 1. The opening of the mask M1 is basically a rhombus having a longitudinal axis parallel to the <110> direction of the substrate and four sides perpendicular to the <111> direction of the substrate, but is actually an octagon because corner portions of the rhombus are cut out.

Figure 9A:
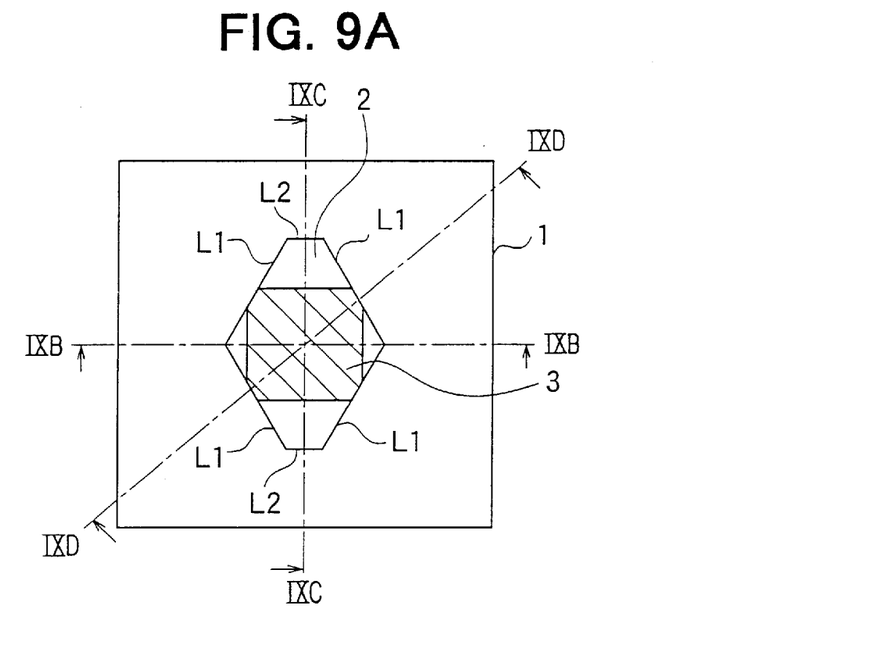
FIG. 9A is a plan view showing the diaphragm formed by the mask pattern shown in FIG. 8.
Figure 9B:
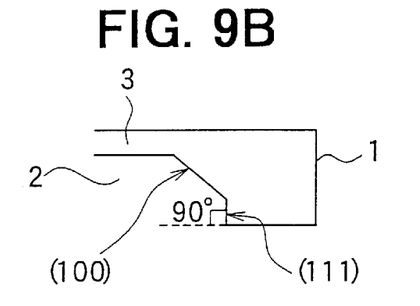
FIG. 9B is a cross-sectional view taken along line IXB—IXB in FIG. 9A.
Figure 9C:
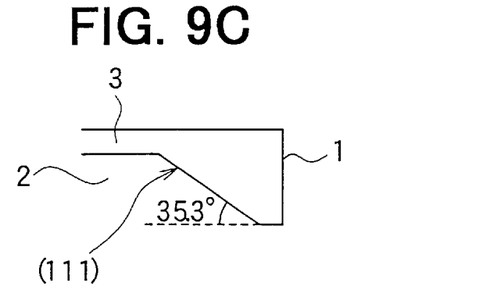
FIG. 9C is a cross-sectional view taken along line IXC—IXC in FIG. 9A.
Figure 9D:
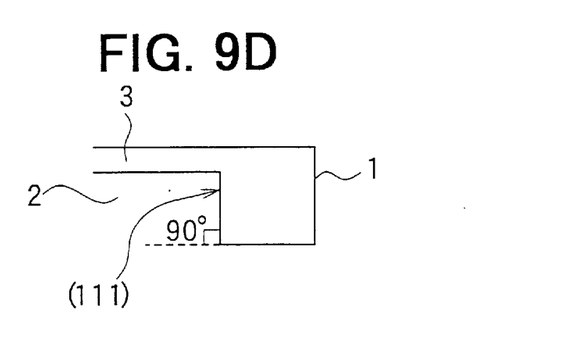
FIG. 9D is a cross-sectional view taken along line IXD—IXD in FIG. 9A.

Anisotropic etching is then performed using this mask pattern. As a result, as shown in FIG. 9A, the recess 2 is formed with a hexagonal opening composed of six sides L1, L2, and the diaphragm 3 is formed as the bottom of the recess 2, having an octagonal shape (corresponding to the hating region in FIG. 9A). At that time, as shown in FIGS. 9B and 9D, each side L1 perpendicular to the <111> direction makes a bonding angle θ of substantially 90° with the surface of the semiconductor substrate 1.

In the semiconductor pressure sensor S2 in the present embodiment, the portion forming the bonding angle θ of substantially 90° is 88% with respect to the entire bonding portion between the semiconductor substrate 1 and the base 4. This ratio corresponds to a ratio of a length of sides that form the bonding angle θ of 90° (the sum of the four sides L1 in length) with respect to an entire length of the six sides L1, L2 constituting the opening of the recess 2.

Figure 10:
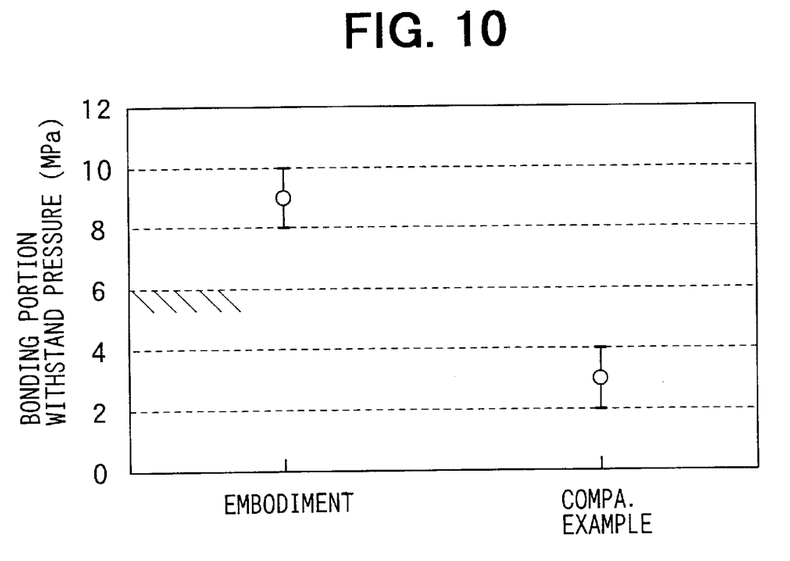
FIG. 10 is a graph that shows an effect for improving a bonding portion withstand pressure.

Here, FIG. 10 shows the result of the effect for improving the bonding strength in the sensor S2 according to the present embodiment, which was examined in comparison with one (comparative example) in which 23% of an entire bonding portion forms the bonding angle θ of 90°. In each case, a sample number was 10. The comparative example was formed by a mask pattern, different from that in the present embodiment, for forming the diaphragm.

Figure 11A:
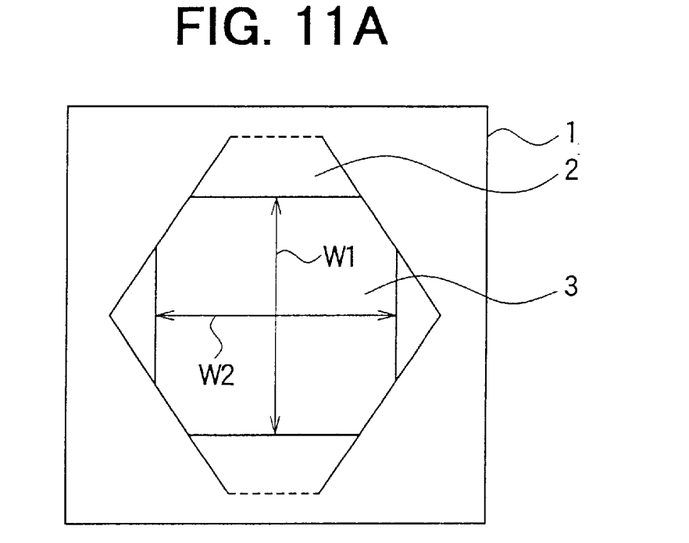
FIGS. 11A and 11B are plan views showing plane shapes of diaphragms of the second embodiment and a comparative example.
Figure 11B:
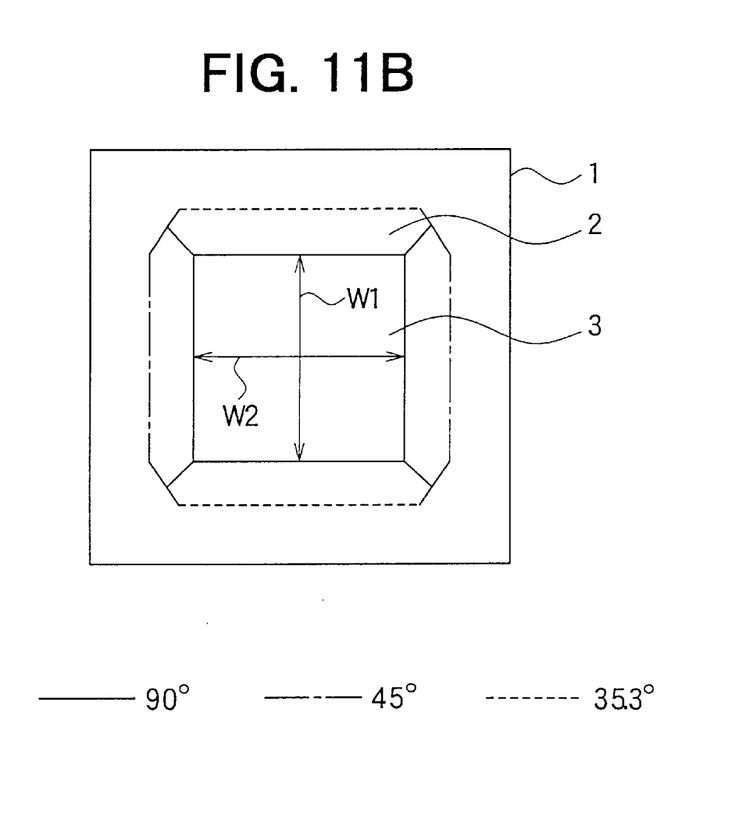

FIGS. 11A and 11B show plane shapes of diaphragms in the present embodiment and in the comparative example, respectively. In the figures, a solid line, a one-dot chain line, and a broken line represent that the bonding angles θ at that portions are 90°, 45°, and 35.3°, respectively. In both the present embodiment and the comparative example, dimensions W1, W2 were 1.3 mm and 1.4 mm, respectively.

According to these examinations, the upper limit of the breaking withstand pressure at the diaphragm 3 in this kind of semiconductor pressure sensor is about 6 MPa at a practical level. As understood from FIG. 10, in the comparative example, the bonding portion between the semiconductor substrate 1 and the base 4 separates previous to the breakage of the diaphragm 3. As opposed to this, in the present embodiment, because the separation withstand-pressure at the bonding portion can be made larger than the breaking withstand pressure of the diaphragm 3, the separation at the bonding portion can be prevented.

Figure 12:
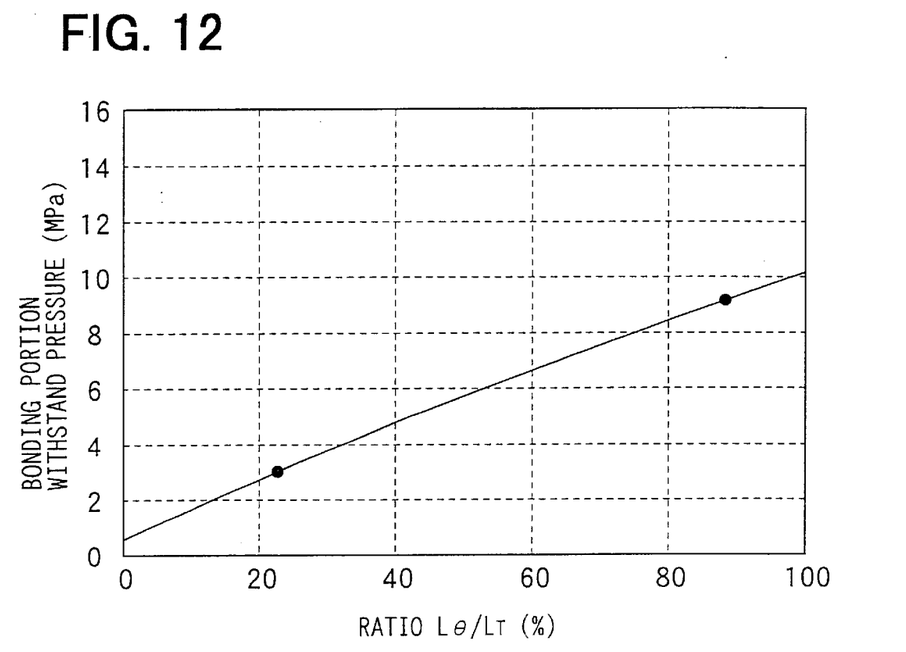
FIG. 12 is a graph showing a relationship between ratio $L_\theta/L_T$ in length of a portion forming a bonding angle of 90° with respect to an entirety of a bonding portion, and separation withstand pressure at the bonding portion.

Next, a relationship between the ratio of the portion forming the bonding angle θ of 90° with respect to the entire bonding portion, and the separation withstand pressure was studied and examined. FIG. 12 shows a relationship between the ratio of the length ($L_\theta$) of the portion making the bonding angle θ of 90° with respect to the entire length ($L_T$), $L_\theta/L_T$ (%), and the separation withstand pressure (MPa) of the bonding portion. The relationship was calculated by the FEM analysis, and points plotted in the graph with mark ● are actual measurements of the present embodiment and the comparative example.

In FIG. 12, the bonding strength between the semiconductor substrate 1 and the base 4 can be improved when the ratio $L_\theta/L_T$ is set so that the separation withstand pressure at the bonding portion becomes larger than the breaking withstand pressure of the diaphragm 3. As a result, the reliability at the bonding portion can be attained. For example, the ratio $L_\theta/L_T$ should be 50% or more when the upper limit (6 MPa) of the breaking withstand pressure of the diaphragm 3 at the practical level is considered as a target lower limit of the separation withstand pressure at the bonding portion.

Although the ratio is 88% in the present embodiment, this ratio is determined in expectation of a safety factor. In view of this point, it is preferable that the ratio is 80% or more. Also, as shown in FIG. 7, if the bonding angle θ is 80° or more, the bonding portion strain is saturated to be approximately equal to that of the case where the bonding angle θ is 90°. Therefore, approximately the same effect as that shown in FIG. 12 can be attained if the bonding angle θ is 80° or more.

Thus, according to the present embodiment, in the back surface pressure-receiving type semiconductor pressure sensor in which the back surface edge portion 2a of the diaphragm 3 is rounded, the portion forming the bonding angle θ being equal to or more than 80° holds more than a certain ratio with respect to the entire bonding portion. Therefore, the bonding strength between the semiconductor substrate 1 and the base 4 can be improved to be or larger than the breaking withstand pressure of the diaphragm 3, thereby resulting in high reliability of the bonding portion.

Incidentally, when the ratio is 100%, i.e., the bonding angle θ is 90° at the entirety of the bonding portion, it is apparently more preferable to improve the bonding strength. This structure is explained with reference to FIGS. 13, 14A to 14C as a modified embodiment.

Figure 13:
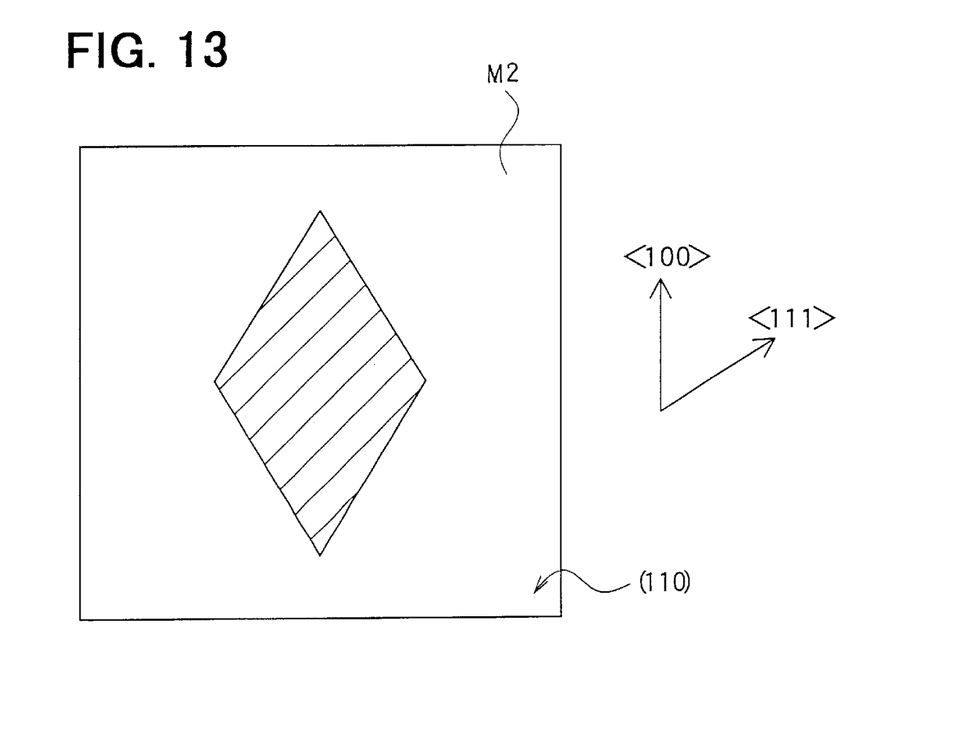
FIG. 13 is a plan view showing a mask pattern for forming a diaphragm as a modification of the second embodiment.
Figure 14A:
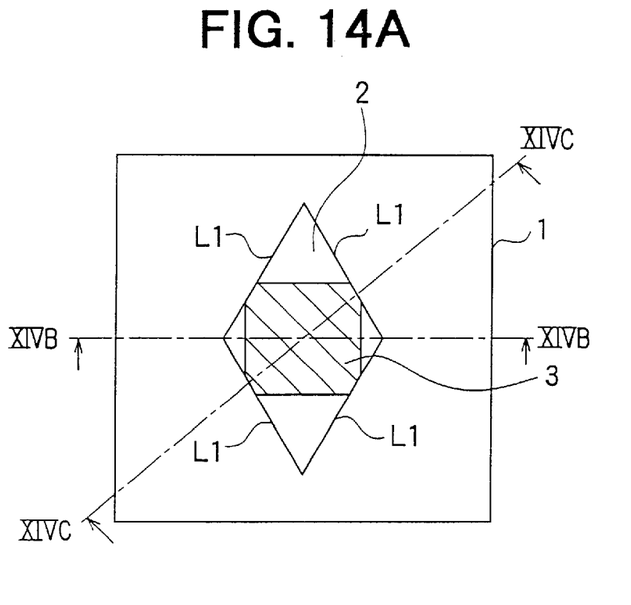
FIG. 14A is a plan view showing the diaphragm formed by the mask pattern shown in FIG. 13.
Figure 14B:
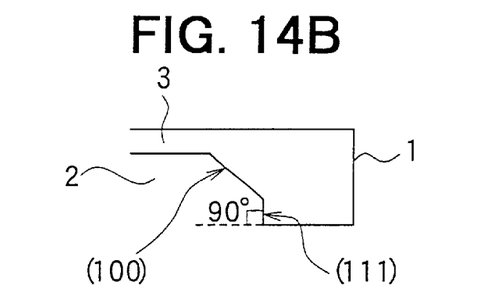
FIG. 14B is a cross-sectional view taken along line XIVB—XIVB in FIG. 14A.
Figure 14C:
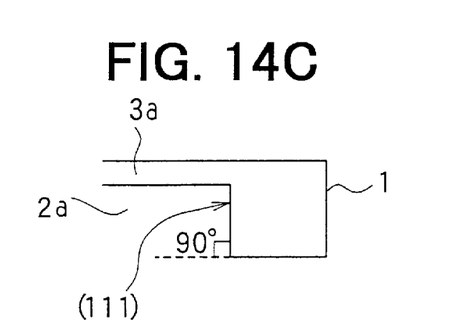
FIG. 14C is a cross-sectional view taken along line XIVC—XIVC in FIG. 14A.

FIG. 13 shows a plane shape of a mask pattern for forming the diaphragm in the modified embodiment, and FIGS. 14A to 14C shows a detailed shape of the diaphragm formed by this mask pattern. In this modified embodiment, a mask M2 having a rhombus opening as shown in FIG. 13 (hatching region in the figure) is formed on the surface of the semiconductor substrate 1 having (110) plane orientation. The opening of the mask M2 has a rhombus shape with a longitudinal axis parallel to the <100> direction and four sides perpendicular to the <111> direction of the substrate.

The anisotropic etching is performed with this mask pattern. Accordingly, as shown in FIG. 14A, the recess 2 is formed with a rhombus opening having four sides L1, and the diaphragm 3 is formed as a bottom of the recess 2, having an octagonal shape (hatching region in the figure). At that time, as shown in FIGS. 14B and 14C, the bonding angle θ is substantially 90° at all the four sides L1 constituting the opening of the recess 2.

The shape of the diaphragm in this modified embodiment is preferable in consideration of only the effect for improving the bonding strength. However, considering the other properties such as sensor sensitivity, the diaphragm shown in FIGS. 9A to 9C are more preferable because the area of the diaphragm can be widened efficiently within one chip.

(Third Embodiment)

In the second embodiment, the semiconductor substrate 1 has the (110) plane on the surface thereof. Because of this, the bonding angle θ of 90° can be realized easily by the anisotropic etching. A third embodiment is directed to a method for forming the diaphragm 3 that can be formed with a bonding angle θ of 90° at the entirety of the bonding portion between the semiconductor substrate 1 and the base 4 regardless of the plane orientation of the semiconductor substrate 1 and the mask pattern shape.

Figure 15A:
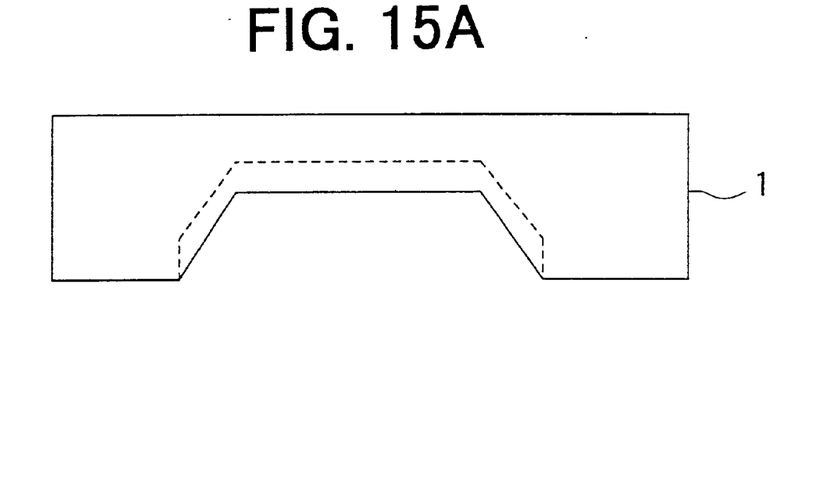
FIGS. 15A and 15B are cross-sectional views showing a method for forming a diaphragm in a third preferred embodiment of the present invention.
Figure 15B:
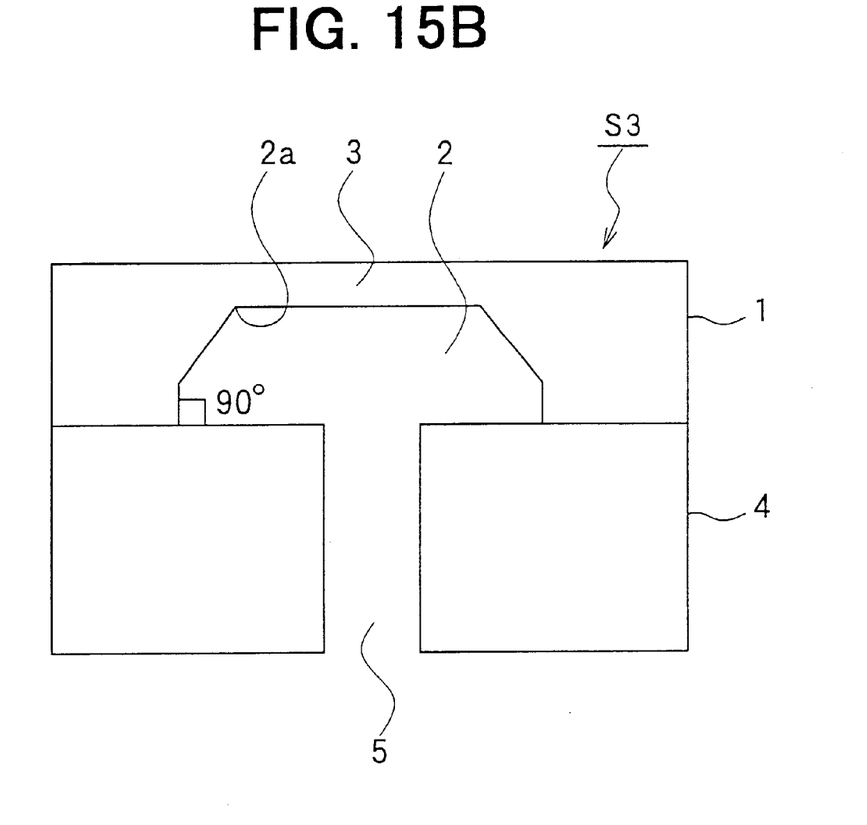
Figure 16A:
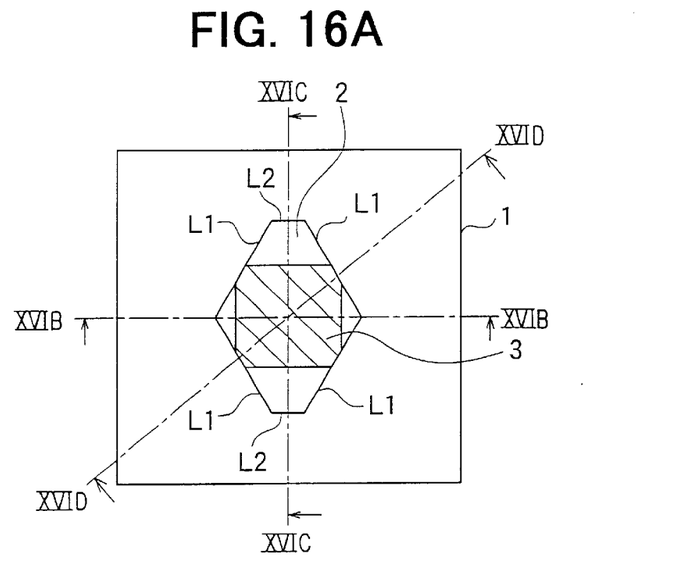
FIG. 16A is a plan view showing a diaphragm as a first example of the third embodiment.
Figure 16B:
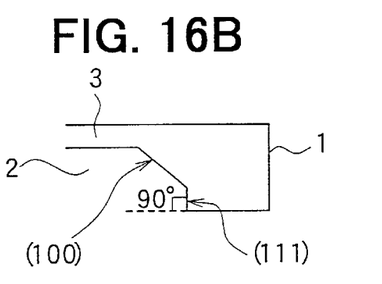
FIG. 16B is a cross-sectional view taken along line XVIB—XVIB in FIG. 16A.
Figure 16C:
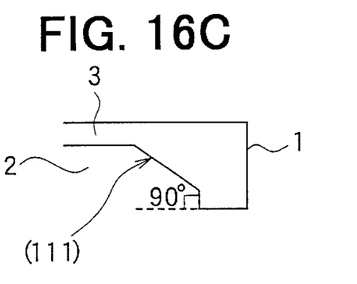
FIG. 16C is a cross-sectional view taken along line XVIC—XVIC in FIG. 16A.
Figure 16D:
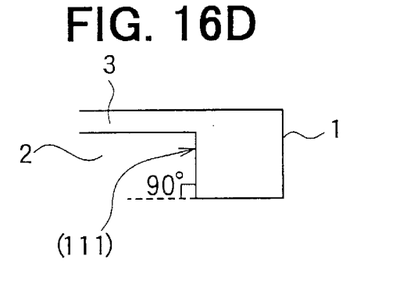
FIG. 16D is a cross-sectional view taken along line XVID—XVID in FIG. 16A.

FIGS. 15A and 15B show a method for forming the diaphragm 3 in this embodiment. First, as shown in FIG. 15A, anisotropic etching using KOH, TMAH or the like as in the second embodiment is performed to a surface of the semiconductor substrate 1 where a mask (not shown) is formed (anisotropic etching step). An etching depth at that time is about two thirds (⅔) or more of the depth of the recess 2 that is finally formed as shown with broken lines in FIG. 15A.

Successively, substantially in the same manner as described in the second embodiment, the corner portion between the bottom surface and the side surface of the recess portion that is formed at the anisotropic etching step is rounded (rounding step). After that, anisotropic vertical etching such as plasma etching is performed using $CF_4$ system gas. Accordingly, the recess portion is further etched, so that the recess 2 is finally formed (anisotropic vertical etching step).

At this step, the bonding angle θ becomes 90° at the entirety of the opening portion of the recess 2 due to the characteristics of the anisotropic vertical etching. The finally formed recess 2 succeeds the shape of the rounded portion formed at the rounding step, i.e., has a rounded shape at the corner portion due to the rounding step. After that, the mask is removed, and the surface of the semiconductor substrate 1 is bonded to the base 4. In consequence, a semiconductor pressure sensor S3 is completed.

Figure 17A:
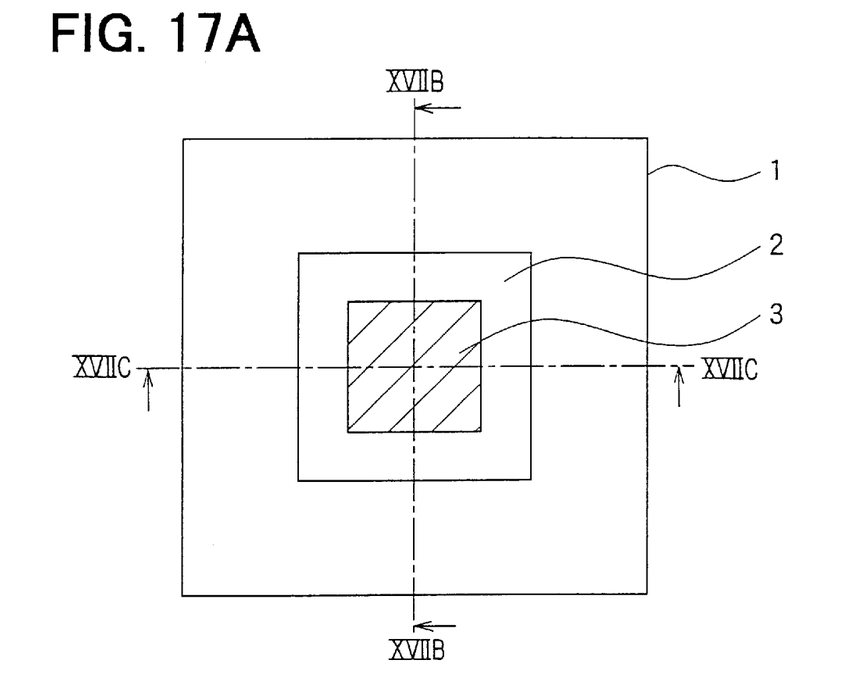
FIG. 17A is a plan view showing a diaphragm as a second example of the third embodiment.
Figure 17B:
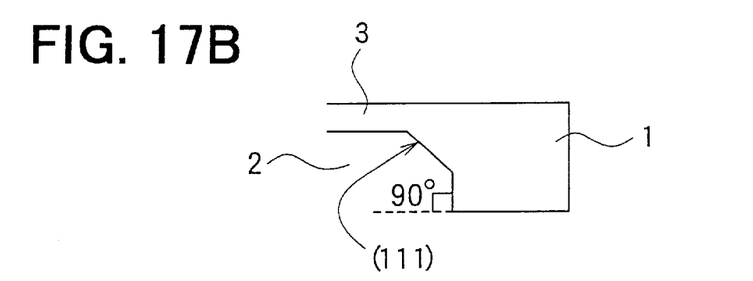
FIG. 17B is a cross-sectional view taken along line XVIIB—XVIIB in FIG. 17A.
Figure 17C:
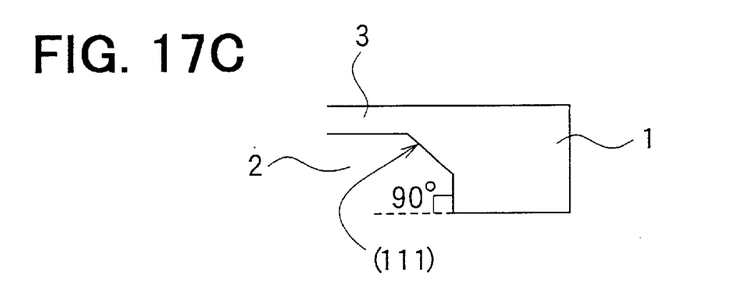
FIG. 17C is a cross-sectional view taken along line XVIIC—XVIIC in FIG. 17A.

FIGS. 16A to 16D and 17A to 17C show two shapes (two examples) of the diaphragm 3 in the semiconductor pressure sensor S3. FIGS. 16A to 16D show a first example that adopts a single crystal silicon substrate having (110) plane orientation as the semiconductor substrate 1, and a mask pattern shown in FIG. 9A. FIGS. 17A to 17C show a second example that adopts a single crystal substrate having (100) plane orientation as the semiconductor substrate 1, and a square mask pattern.

In both the first and second examples, the bonding angle θ is 90° at the entirety of the bonding portion between the semiconductor substrate 1 and the base 4. In the first example shown in FIGS. 16A to 16D, the bonding angle θ is 90° even at the same part as that shown in FIG. 9C where the bonding angle θ is 35.3° (part corresponding to side L2). Thus, according to the present embodiment, the bonding angle θ can be made 90° at the entirety of the bonding portion between the semiconductor substrate 1 and the base 4 regardless of the plane orientation of the semiconductor substrate 1 and the mask pattern, by performing the anisotropic vertical etching at the end of the etching step for forming the diaphragm 3.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor pressure sensor comprising:

a semiconductor substrate having a recess formed on a surface thereof by anisotropic etching, the recess having a sidewall, a bottom wall that serves as a diaphragm for detecting a pressure, and a corner portion provided between the sidewall and the diaphragm, the corner portion being rounded and having a radius of curvature R, wherein:

the radius of curvature R of the corner portion satisfies a formula of;

$$R/S = 526 \cdot (d/S)^2 - 0.037 \cdot (d/S) + a1$$

where S is an area of the diaphragm, d is a thickness of the diaphragm, 526 and 0.037 are proportional constants and a1 is a correction value that is in a range of $9.6 \times 10^{-7}$ to $16 \times 10^{-7}$ inclusive.

2. The semiconductor pressure sensor according to claim 1, wherein a1 is $9.6 \times 10^{-7}$.

3. The semiconductor pressure sensor according to claim 1, further comprising a base bonded to the semiconductor substrate at an opposite side of the diaphragm.

4. The semiconductor pressure sensor according to claim 1, wherein the diaphragm has an octagonal plane shape.

5. A semiconductor pressure sensor comprising:

a semiconductor substrate having a recess formed on a surface thereof, the recess having a sidewall, a bottom wall that serves as a diaphragm, and a corner portion provided between the sidewall and the diaphragm for detecting a pressure, the corner portion being rounded; and a base having a bonding surface bonded to the semiconductor substrate at an opposite side of the diaphragm and defining a pressure introduction passage for introducing the pressure to the diaphragm, wherein:

a bonding angle defined between the sidewall of the recess and the bonding surface of the base is equal to or larger than 80° so that a separation withstand pressure of a bonding portion where the bonding surface is bonded to the semiconductor substrate is larger than a breaking withstand pressure of the diaphragm, the surface of the semiconductor substrate has a (110) plane orientation, and the sidewall of the recess has a (111) plane orientation.

6. The semiconductor pressure sensor according to claim 5, wherein a length of a portion defining the bonding angle equal to or larger than 80° holds 50% at least with respect to an entire length of the bonding portion surrounding the recess.

7. The semiconductor pressure sensor according to claim 6, wherein the length of the portion holds 80% at least with respect to the entire length of the bonding portion surrounding the recess.

8. The semiconductor pressure sensor according to claim 5, wherein the bonding angle is equal to or larger than 80° at an entirety of the bonding portion surrounding the recess.

9. The semiconductor pressure-sensor according to claim 8, wherein the bonding angle is approximately equal to 90° at the entirety of the bonding portion surrounding the recess.

10. The semiconductor pressure sensor according to claim 5, wherein:

the surface of the semiconductor substrate is a (110) plane; and the side surface of the recess is a (111) plane.

* * * * *